United States Patent
Kordesch

(10) Patent No.: US 6,486,044 B2
(45) Date of Patent: Nov. 26, 2002

(54) BAND GAP ENGINEERING OF AMORPHOUS AL-GA-N ALLOYS

(75) Inventor: Martin E. Kordesch, The Plains, OH (US)

(73) Assignee: Ohio University, Athens, OH (US)

( * ) Notice: Subject to any disclaimer, the term of this patent is extended or adjusted under 35 U.S.C. 154(b) by 0 days.

(21) Appl. No.: 10/086,492

(22) Filed: Mar. 1, 2002

(65) Prior Publication Data

US 2002/0098616 A1 Jul. 25, 2002

Related U.S. Application Data

(63) Continuation of application No. 09/431,339, filed on Oct. 29, 1999.

(51) Int. Cl.[7] ............................................... H01L 21/20
(52) U.S. Cl. ...................................................... 438/482
(58) Field of Search ......................................... 438/482

(56) References Cited

U.S. PATENT DOCUMENTS

| | | | |
|---|---|---|---|
| 3,926,682 A | | 12/1975 | Shimada et al. |
| 3,979,271 A | | 9/1976 | Noreika et al. |
| 4,213,781 A | * | 7/1980 | Noreika et al. ............. 75/134 |
| 4,616,248 A | | 10/1986 | Khan et al. |
| 4,798,701 A | | 1/1989 | David |
| 4,957,604 A | | 9/1990 | Steininger |
| 4,971,928 A | | 11/1990 | Fuller |
| 5,562,781 A | | 10/1996 | Ingram et al. |
| 5,567,647 A | | 10/1996 | Takahashi |
| 5,952,680 A | | 9/1999 | Strite |
| 5,976,398 A | | 11/1999 | Yagi |
| 6,126,740 A | * | 10/2000 | Schulz et al. ............... 117/4 |
| 6,255,669 B1 | | 7/2001 | Birkhahn et al. |
| 6,316,820 B1 | | 11/2001 | Schmitz et al. |
| 6,346,720 B1 | | 2/2002 | Iyechika et al. |

FOREIGN PATENT DOCUMENTS

| | | |
|---|---|---|
| EP | 0 342 894 | 11/1989 |
| EP | 0 996 173 A2 | 4/2000 |
| WO | WO 99/36968 | 7/1999 |

OTHER PUBLICATIONS

Barnett et al. "Growth of high–qualtiy epitaxial GaAs films by sputter deposition" Appl. Phys Lett. V37, 1980, pp 734–736.*

Kim et al. "Thermally stable ohmic contacts to n–type GaAs. VIII. Sputter–deposited InAs contacts" J. Appl. Phys. V68, 1990, pp2475–2481.*

Chen et al., Band Gap Engineering in Amorphous A1xgal–xn: Experiment and Ab Inito Calculations; Appl. Phys.; Apr. 21, 2000; pp. 1117–1118; vol. 77; Issue No. 8; American Institute of Physics.

(List continued on next page.)

*Primary Examiner*—Olik Chaudhuri
*Assistant Examiner*—Douglas A. Wille
(74) *Attorney, Agent, or Firm*—Killworth, Gottman, Hagan & Schaeff, L.L.P.

(57) ABSTRACT

A semiconductor structure and a scheme for forming a layer of amorphous material on a semiconductor substrate are provided. In accordance with one embodiment of the present invention, a semiconductor structure is provided comprising an amorphous alloy formed over at least a portion of a semiconductor substrate. The amorphous alloy comprises amorphous aluminum nitride (AlN) and amorphous gallium nitride (GaN). The amorphous alloy may be characterized by the following formula:

$$Al_xGa_{1-x}N$$

where x is a value greater than zero and less than one. The amorphous alloy may further comprise indium nitride. Relative proportions of aluminum and gallium in the amorphous aluminum gallium nitride alloy are controlled to engineer the band gap of the amorphous alloy.

19 Claims, 1 Drawing Sheet

OTHER PUBLICATIONS

Sudhir et al., Control of the Structure and Surface Morphology of Gallium Nitride and Aluminum Nitride Thin Films by Nitrogen Background Pressure in Pulsed Laser Deposition; Journal of Electronic Materials: Nov. 20, 1997: pp. 215–221 vol. 27 No. 4.

Yaji et al., Preparation of Aln and Gan Thin Films by Reactive Ion Beam Sputtering and Optical Properties; Inst. Phys. Conf.; 1996; pp. 911–914; IOP Publishing Ltd; Kyoto, Japan.

Takeshi, Patent Abstracts of Japan; Apr. 12, 1998; Japan.

Azema et al., Plasma–enhanced Chemical Vapour Deposition of Aln (1010); Microstructural Study of the Interlayers; Journal of Crystal Growth; 1993; pp. 621–628; Elsevier Science Publishers B v: Amsterdam NL.

Gurumurugan et al., Visible Cathodoluminescence of Er–doped Amorphous AlN thin films; Applied Physics Letters; May 17, 1999; pp. 3008–3010; vol. 74, No. 20; American Institute of Physics.

Carlone et al., Journal of Appl. Phys; Jun. 1, 1984; pp. 4010–4014; vol. 55, No. 11; American Institute of Physics.

Caldwell et al., Visible Emission from Thin–Film Phosphors of Amorphous AlN: Cu, Mn, and Cr.; 5 pgs.

Caldwell et al., Emission Properties of an Amorphous AlN: Cr3+ Thin–Film Phosphor; Applied Physics Letters; Jan. 2, 2001; pp. 1246–1248; vol. 78, issue 9; American Institute of Physics.

Dimitrova et al., Photo–, Cathodo–, a nd Electroluminescence Studies of Sputter Deposited AlN:Er Thin Films; Applied Surface Science; Oct. 26, 2000; pp. 1–4; Elsevier Science B.V.

Dimitrova et al., Green Emission from Er–Doped AlN Thin Films Prepared by RF Magnetron Sputtering; Mat. Res. Soc. Symp.Proc.; 2000; Q5.4.1–Q5.4.6; Materials Research Society.

Jadwisienczak et al., Luminescence of Tb Ions Implanted Into Amorphous AlN Thin Films Grown by Sputtering; Applied Physics Letters; Apr. 10, 2000; pp. 3376–3378; vol. 76, No. 23; American Institute of Physics.

Dimitrova et al., Visible Emission from Electroluminescent Devices Using an Amorphous AlN:Er3+ Thin Film Phosphor; Applied Physics Leter; Jul. 24, 2000; pp. 478–479; vol. 77, No. 4: American Institute of Physics.

Stumm et al., "Can Amorphous GaN Serve as a Useful Electronic Material?" The American Physical Society, 1997, pp. 677–680.

Deposition; Journal of Electronic Materials; Nov. 20, 1997; pp. 215–221; vol. 27, No. 4.

* cited by examiner

BAND GAP ENGINEERING OF AMORPHOUS AL-GA-N ALLOYS

CROSS REFERENCE TO RELATED APPLICATION

This application is a continuation in part of U.S. patent application Ser. No. 09/431,339, filed Oct. 29, 1999.

STATEMENT REGARDING FEDERALLY SPONSORED RESEARCH OR DEVELOPMENT

This invention was made with government support under Contract No. N00014-96-1-0782 awarded by Ballistic Missile Defense Organization. The Government has certain rights in this invention.

BACKGROUND OF THE INVENTION

The present invention relates to an improved semiconductor material and a method of its production. More specifically the present invention relates to an amorphous semiconductor alloy including aluminum and gallium and to a method of production that allows for convenient band gap engineering of the alloy and for deposition of the alloy on a variety of vacuum compatible materials.

Crystalline GaN, AlGaAs, GaAs, and InGaP have enjoyed success in a number of electronic and optical applications. For example, light emitting diodes formed of AlGaAs, GaAs, and InGaP have been proposed using epitaxial crystal growth techniques, see U.S. Pat. No. 4,971,928. UV detectors formed of crystalline $Al_xGa_{1-x}N$ are proposed in U.S. Pat. No. 4,616,248. The present invention is partially based upon the recognition that the success of these crystalline semiconductor materials is limited by the various processes for their production because these processes necessarily incorporate specific steps to preserve the crystalline state of the semiconductor material.

For example a typical semiconductor deposition scheme is presented in U.S. Pat. No. 3,979,271, where solid layer semiconductor compositions are deposited by simultaneously sputtering and discharge reacting materials and depositing the materials on a heated substrate. The substrate is typically heated above 300° C. to provide polycrystalline growth and typically to above 500° C. to provide highly oriented, epitaxial growth. Higher temperatures may be needed for epitaxial growth on silicon substrates. The present inventors have recognized that these particular heating steps limit the availability of economical electronic and optical devices including conventional crystalline materials. Accordingly, there is a need for an improved semiconductor material and a more versatile method of depositing such a semiconductor material.

BRIEF SUMMARY OF THE INVENTION

This need is met by the present invention wherein a semiconductor structure and a scheme for engineering a band gap of an amorphous material and forming a layer of the amorphous material on a semiconductor substrate are provided. In accordance with one embodiment of the present invention, a semiconductor structure is provided comprising an amorphous alloy formed over at least a portion of a semiconductor substrate. The amorphous alloy comprises aluminum nitride (AlN) and gallium nitride (GaN) and may be characterized by a band gap between about 3 eV and about 6 eV. The amorphous alloy may be characterized by the following formula:

$Al_xGa_{1-x}N$ where x is a value greater than zero and less than one.

The amorphous alloy may further comprise indium nitride and may be characterized by a band gap between about 2 eV and about 6 eV. A dopant may be incorporated into the amorphous alloy. The dopant may comprise a rare earth element or, more specifically, a rare earth luminescent center.

In accordance with another embodiment of the present invention, a method of forming a layer of amorphous material on a semiconductor substrate is provided. The method comprising the steps of: (i) positioning the semiconductor substrate in a reactive sputter deposition chamber of a reactive sputtering system including at least one sputter target containing aluminum and gallium; (ii) introducing a nitrogen gas into the sputter deposition chamber; (iii) operating the sputtering system to promote reaction of aluminum and gallium from the sputter target and nitrogen from the gas in the sputter deposition chamber; (iv) maintaining the semiconductor substrate at a deposition temperature selected to promote growth of an amorphous aluminum gallium nitride alloy on the semiconductor substrate; and (v) further operating the sputtering system so as to designate relative proportions of aluminum and gallium in the amorphous aluminum gallium nitride alloy.

The sputter target may comprise a single integrated common target, a pair of discrete target portions, where one of the target portions contains aluminum and the other of the target portions contains gallium, or a pair of targets, where one of the targets contains aluminum and the other of the targets contains gallium. The method may further comprise the step of varying the relative proportions of aluminum and gallium in the amorphous aluminum gallium nitride alloy so as to selectively control a band gap of the alloy.

The sputter target may further include indium and the method may further comprise the steps of: (i) operating the sputtering system to promote reaction of aluminum, gallium, and indium from the sputter target and nitrogen from the gas in the sputter deposition chamber; (ii) maintaining the semiconductor substrate at a deposition temperature selected to promote growth of an amorphous indium aluminum gallium nitride alloy on the semiconductor substrate; and (iii) operating the sputtering system so as to designate relative proportions of indium, aluminum, and gallium in the amorphous aluminum gallium nitride alloy.

The method may further comprise the step of introducing a dopant into the amorphous alloy. The dopant may comprise a rare earth element or, more specifically, a rare earth luminescent center.

In accordance with yet another embodiment of the present invention, a semiconductor material is provided comprising an amorphous alloy including amorphous aluminum nitride (AlN) and amorphous gallium nitride (GaN). The amorphous alloy may further include amorphous indium nitride.

Accordingly, it is an object of the present invention to provide an improved semiconductor structure and a convenient scheme for forming a layer of amorphous material on a semiconductor substrate. Other objects of the present invention will be apparent in light of the description of the invention embodied herein.

BRIEF DESCRIPTION OF THE DRAWING

The following detailed description of the preferred embodiments of the present invention can be best understood when read in conjunction with FIG. 1, which is a schematic illustration of a system and method for forming a layer of amorphous material on a semiconductor substrate according to one aspect of the present invention.

DETAILED DESCRIPTION OF THE PREFERRED EMBODIMENTS

Figure 1:
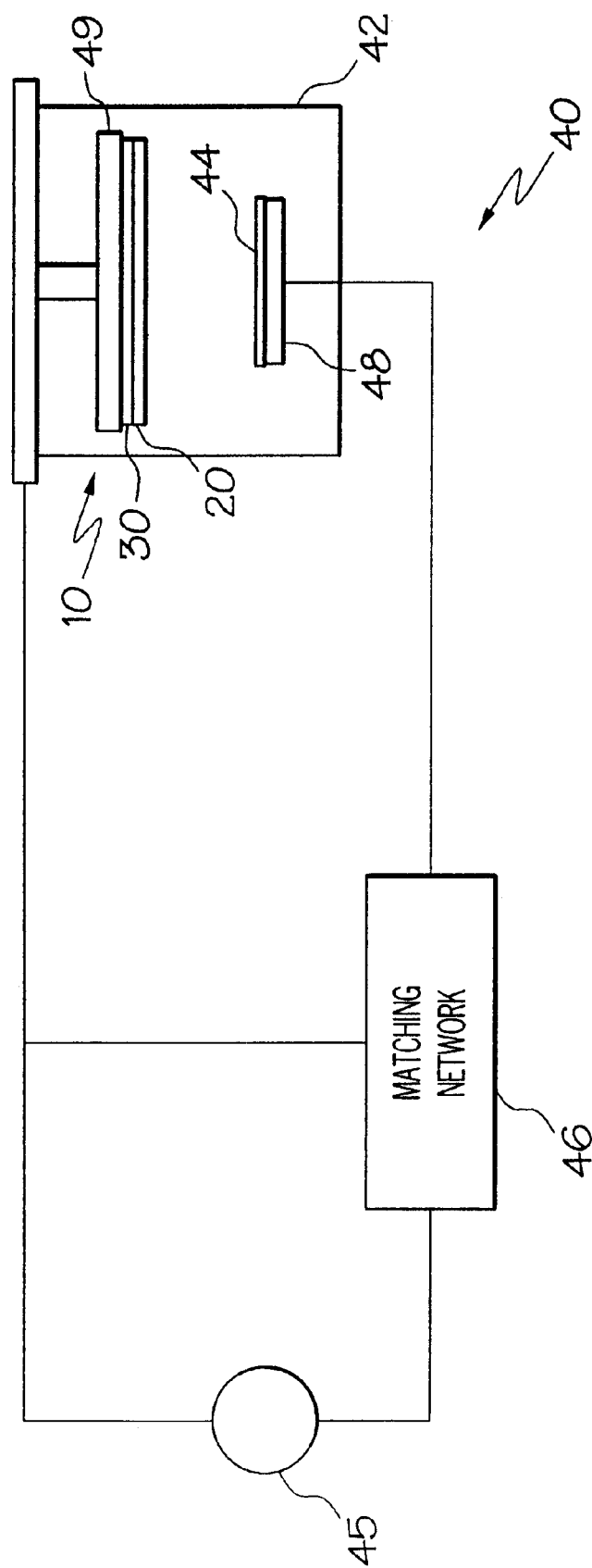

A semiconductor structure 10 according to the present invention is illustrated in FIG. 1 and comprises an amorphous alloy 20 formed over at least a portion of a semiconductor substrate 30. The amorphous alloy 20 comprises amorphous aluminum nitride (AlN) and amorphous gallium nitride (GaN) and is characterized by a band gap between about 3 eV and about 6 eV. For the purposes of describing and defining the present invention, it is noted that a layer of material formed over a substrate may be partially embedded in the substrate, may be formed directly on the substrate, or may be formed on an intermediate layer or layers that are formed directly on the substrate.

The amorphous alloy 20 of the present invention. is a wide band gap semiconductor that may be doped and readily integrated with silicon technology. Specifically, the amorphous alloy of the present invention may be easily deposited or grown on silicon and may be processed at temperatures that are compatible with the entire range of silicon fabrication technology. The amorphous alloy of the present invention may also be etched more easily than most crystalline nitrides.

In a specific embodiment of the present invention, the alloy is doped with a rare earth luminescent center. The resulting rare earth luminescent device may be utilized for photonics application and may be engineered with band gaps optimized for efficient electroluminescence. Possible applications include wavelength dispersive multiplexing devices, where sharp atomic resonance emission lines are particularly well-suited for fiber-optic communication.

The amorphous alloy 20 of the present invention may be grown on the semiconductor substrate 30 in a reactive sputtering system 40, illustrated schematically in FIG. 1. Specifically, the semiconductor substrate 30 is positioned on an anode 49 within a reactive sputter deposition chamber 42 containing a carrier gas comprising nitrogen or a mixture of nitrogen and argon or another inert gas and at least one sputter target 44. The sputter target 44 contains aluminum and gallium and may comprise a single integrated target containing both aluminum and gallium or a pair of discrete targets or target portions, one containing aluminum and the other containing gallium. For example, according to one aspect of the present invention, the target 44 comprises a solid aluminum target where a portion of the aluminum is removed and replaced with a gallium-filled reservoir. The aluminum portion of target 44 is typically made from aluminum having 99.999% purity, and the gallium portion of target 44 is typically made from gallium having 99.999% purity. The remaining components of the reactive sputtering system are conventional and include an RF source 45, a matching network 46, a target cathode 48, and the anode 49.

Nitrogen gas is introduced into the sputter deposition chamber 42 and the chamber is operated to encourage the necessary reactive sputtering of the aluminum, gallium, and nitrogen. Typically, argon or another inert carrier gas is also present in the sputter deposition chamber 42. The nitrogen gas introduced into the sputter deposition chamber typically is 99.9995% pure. The general manner in which the reactive sputtering of the present invention is initiated is not the subject of the present invention and may be readily gleaned from existing RF reactive sputtering technology. It is noted, however, that the particular materials utilized in the reactive sputtering scheme of the present invention and the manner in which the sputter reaction is controlled to engineer the growth of the amorphous alloy 20 are the subject matter of the present invention. Specifically, the respective compositions of the first and second sputter targets are selected to introduce aluminum and gallium into the reaction process of the present invention. Further, the relative proportions of the aluminum and gallium introduced into the reaction are controlled to engineer the band gap of the amorphous alloy 20 within, for example, a range of about 3 eV to about 6 eV. Finally, the temperature of the substrate on which the alloy is grown is controlled at a relatively low value, e.g., between about 77K to about 300K, to assure that the alloy grown on the substrate is an amorphous alloy 20.

The amorphous alloy 20 is characterized by the following formula:

$$Al_xGa_{1-x}N$$

where the value of x is greater than zero and less than one. The band gap of the amorphous aluminum gallium nitride alloy 20 is a direct function of the relative proportions of aluminum and gallium in the amorphous alloy and these proportions are designated by suitable control of the reactive sputtering system 40. For example, desired proportions of aluminum and gallium in the amorphous alloy 20 may be generated by controlling or designating the relative proportions of aluminum and gallium in the sputter target 44. More specifically, a specific portion or portions of the surface area of the target 44 may be dedicated to aluminum and a corresponding portion or portions may be dedicated to gallium. Alternatively, where two discrete targets or target portions are utilized according to the present invention, the RF power to which each target or target portion is subject may be varied to control the desired proportions of aluminum and gallium in the amorphous alloy 20. As can be seen from this description, the amorphous alloy 20 is formed on top of the substrate 30, but the formation process does not utilize the components of the substrate 30 to form the amorphous alloy 20. As a result, the amorphous alloy 20 does not contain impurities from the substrate.

According to one embodiment of the present invention, the band gap lies between about 3 eV and about 6 eV. According to a further embodiment of the present invention, the sputter target 44 further includes amorphous indium and the method further comprises the step of operating the sputtering system 40 to promote reaction of aluminum, gallium, nitrogen, and indium in the sputter deposition chamber 44 and growth of amorphous indium aluminum gallium nitride alloy on the semiconductor substrate 30. Typically, the indium will have a purity of 99.999%. As would be appreciated by those practicing the present invention, the sputtering system may be operated to designate relative proportions of indium, aluminum, and gallium in the amorphous aluminum gallium nitride alloy. The band gap of the amorphous indium aluminum gallium nitride alloy may extend as low as about 2 eV.

The amorphous alloy 20 of the present invention does not contain substantial amounts of hydrogen. The inclusion of hydrogen in an amorphous semiconductor film can cause passivation or compensation in a doped film. Hydrogen can occupy a site in the semiconductor in place of the intended dopant, and hydrogen can move through the semiconductor. Therefore, the inclusion of hydrogen in the semiconductor can passivate the semiconductor and prevent the semiconductor from functioning properly when doped. Additionally, the amorphous alloy 20 of the present invention does not contain detectable amounts of carbon. The inclusion of carbon in an amorphous semiconductor film can cause defect levels in the films. Defect levels can cause the amorphous semiconductor to function poorly as a photoelectric material. Finally, the inclusion of even small amounts oxygen in the amorphous alloy 20 can raise the band gap, thus affecting the linear variation in the band gap. Therefore, the target 44 of the present invention is generally 99.999% pure with respect to hydrogen, carbon, and oxygen, in order to ensure that the amorphous alloy 20 does not contain substantial amounts of hydrogen, carbon, or oxygen.

The amorphous alloy of the present invention may contain impurities that do not affect the linear variation in band gap or electronic properties. For example, the amorphous alloy could contain impurities such as copper or tin because these metals do not react with nitrogen. However, the target 44 of the present invention is generally at least 99% pure with respect to metals in order to ensure a linear variation in band gap. More typically, the target 44 will be 99.99% pure with respect to metals in order to ensure good electronic properties of amorphous alloy 20.

For the purposes of describing and defining the present invention, it will be understood that the term "consisting essentially of" with respect to the target 44 and the amorphous alloy 20 corresponds to the purity levels discussed above.

Having described the invention in detail and by reference to preferred embodiments thereof, it will be apparent that modifications and variations are possible without departing from the scope of the invention defined in the appended claims.

What is claimed is:

1. A method of forming a layer of amorphous material on a substrate, said method comprising the steps of:

positioning said substrate in a reactive sputter deposition chamber of a reactive sputtering system including at least one sputter target containing aluminum and gallium;

introducing a carrier gas including nitrogen into said sputter deposition chamber;

operating said sputtering system to promote reaction of aluminum and gallium from said sputter target and nitrogen from said gas in said sputter deposition chamber;

maintaining said substrate at a deposition temperature selected to promote growth of an amorphous aluminum gallium nitride alloy on said substrate; and further operating said sputtering system so as to designate relative proportions of aluminum and gallium in said amorphous aluminum gallium nitride alloy.

2. A method of forming a layer of amorphous material on a substrate as claimed in claim 1 wherein said at least one sputter target comprises a single integrated common target.

3. A method of forming a layer of amorphous material on a substrate as claimed in claim 1 wherein said at least one sputter target comprises a pair of discrete target portions, one of said target portions containing aluminum and the other of said target portions containing gallium.

4. A method of forming a layer of amorphous material on a substrate as claimed in claim 1 wherein said at least one sputter target comprises a pair of targets one of said targets containing aluminum and the other of said targets containing gallium.

5. A method of forming a layer of amorphous material on a substrate as claimed in claim 1 further comprising the step of varying said relative proportions of aluminum and gallium in said amorphous aluminum gallium nitride alloy so as to selectively control a band gap of said alloy.

6. A method of forming a layer of amorphous material on a substrate as claimed in claim 5 wherein said band gap lies between about 3 eV and about 6 eV.

7. A method of forming a layer of amorphous material on a substrate as claimed in claim 1 wherein said deposition temperature is between about 77 K to about 300K.

8. A method of forming a layer of amorphous material on a substrate as claimed in claim 1 wherein said amorphous material is substantially free of hydrogen.

9. A method of forming a layer of amorphous material on a substrate as claimed in claim 1 wherein said amorphous material is substantially free of carbon.

10. A method of forming a layer of amorphous material on a substrate as claimed in claim 1 wherein said amorphous material is substantially free of oxygen.

11. A method of forming a layer of amorphous material on a substrate as claimed in claim 1 wherein said amorphous material is substantially free of metal impurities.

12. A method of forming a layer of amorphous material on a substrate as claimed in claim 1 wherein said sputter target further includes indium and wherein said method further comprises the steps of:

operating said sputtering system to promote reaction of aluminum, gallium, and indium from said sputter target and nitrogen from said gas in said sputter deposition chamber;

maintaining said substrate at a deposition temperature selected to promote growth of an amorphous indium aluminum gallium nitride alloy on said substrate; and operating said sputtering system so as to designate relative proportions of indium, aluminum, and gallium in said amorphous indium aluminum gallium nitride alloy.

13. A method of forming a layer of amorphous material on a substrate as claimed in claim 12 further comprising the step of varying said relative proportions of indium, aluminum, and gallium in said amorphous indium aluminum gallium nitride alloy so as to selectively control a band gap of said alloy.

14. A method of forming a layer of amorphous material on a substrate as claimed in claim 13 wherein said band gap lies between about 2 eV and about 6 eV.

15. A method of forming a layer of amorphous material on a substrate as claimed in claim 1 further comprising the step of introducing a dopant into said amorphous alloy.

16. A method of forming a layer of amorphous material on a substrate as claimed in claim 15 wherein said dopant comprises a rare earth element.

17. A method of forming a layer of amorphous material on a substrate as claimed in claim 16 wherein said dopant comprises a rare earth luminescent center.

18. A method of forming a layer of amorphous material on a substrate, said method comprising the steps of:

positioning said substrate in a reactive sputter deposition chamber of a reactive sputtering system including at least one sputter target consisting essentially of aluminum and gallium;

introducing a carrier gas including nitrogen into said sputter deposition chamber;

operating said sputtering system to promote reaction of aluminum and gallium from said sputter target and nitrogen from said gas in said sputter deposition chamber;

maintaining said substrate at a deposition temperature selected to promote growth of an alloy consisting essentially of amorphous aluminum gallium nitride on said substrate; and further operating said sputtering system so as to designate relative proportions of aluminum and gallium in said amorphous aluminum gallium nitride alloy.

19. A method of forming a layer of amorphous material on a substrate, said method comprising the steps of:

positioning said substrate in a reactive sputter deposition chamber of a reactive sputtering system including at least one sputter target consisting essentially of indium, aluminum, and gallium;

introducing a carrier gas including nitrogen into said sputter deposition chamber;

operating said sputtering system to promote reaction of indium, aluminum and gallium from said sputter target and nitrogen from said gas in said sputter deposition chamber;

maintaining said substrate at a deposition temperature selected to promote growth of an alloy consisting essentially of amorphous indium aluminum gallium nitride on said substrate; and further operating said sputtering system so as to designate relative proportions of indium, aluminum, and gallium in said amorphous indium aluminum gallium nitride alloy.

* * * * *

UNITED STATES PATENT AND TRADEMARK OFFICE
CERTIFICATE OF CORRECTION

PATENT NO. : 6,486,044 B2
DATED : November 26, 2002
INVENTOR(S) : Martin E. Kordesch It is certified that error appears in the above-identified patent and that said Letters Patent is hereby corrected as shown below:

<u>Title page, Item [54] and Column 1, lines 1 and 2,</u>
"BAND GAP ENGINEERING OR AMORPHOUS AL-GA-N ALLOYS" should be
-- BAND GAP ENGINEERING OF AMORPHOUS Al-Ga-N ALLOYS --

Signed and Sealed this

Twentieth Day of May, 2003

JAMES E. ROGAN
*Director of the United States Patent and Trademark Office*